United States Patent
Kolomvakis et al.

(10) Patent No.: US 11,843,408 B2
(45) Date of Patent: Dec. 12, 2023

(54) RECONSTRUCTION OF CLIPPED SIGNALS

(71) Applicant: Telefonaktiebolaget LM Ericsson (publ), Stockholm (SE)

(72) Inventors: Nikolaos Kolomvakis, Södertälje (SE); Thomas Eriksson, Gothenburg (SE); Mikael Coldrey, Borås (SE); Mats Viberg, Karlskrona (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 224 days.

(21) Appl. No.: 17/605,453

(22) PCT Filed: Apr. 23, 2019

(86) PCT No.: PCT/EP2019/060364
§ 371 (c)(1),
(2) Date: Oct. 21, 2021

(87) PCT Pub. No.: WO2020/216434
PCT Pub. Date: Oct. 29, 2020

(65) Prior Publication Data
US 2022/0200646 A1    Jun. 23, 2022

(51) Int. Cl.
*H04B 1/12*    (2006.01)
*H04B 1/16*    (2006.01)
*H04B 7/0413*    (2017.01)
*H04L 25/02*    (2006.01)

(52) U.S. Cl.
CPC .............. *H04B 1/123* (2013.01); *H04B 1/16* (2013.01); *H04B 7/0413* (2013.01); *H04L 25/0256* (2013.01)

(58) Field of Classification Search
CPC . H04B 1/123; H04B 1/16; H04B 1/62; H04B 1/12
See application file for complete search history.

(56) References Cited

U.S. PATENT DOCUMENTS

| | | | |
|---|---|---|---|
| 6,606,047 B1 * | 8/2003 | Borjesson | H03M 1/12 708/290 |
| 9,679,578 B1 * | 6/2017 | Bullough | H03G 11/008 |
| 11,362,694 B1 * | 6/2022 | Laufer | H04L 27/2647 |
| 2008/0218395 A1 | 9/2008 | Tomioka et al. | |
| 2022/0190963 A1 * | 6/2022 | Horn | H04L 1/1819 |

FOREIGN PATENT DOCUMENTS

WO    2008/065108 A1    6/2008

OTHER PUBLICATIONS

International Search Report and Written Opinion dated Dec. 6, 2019 in International Application No. PCT/EP2019/060364 (11 pages total).
Themelis, K. E et al., "A Novel Hierarchical Bayesian Approach for Sparse Semisupervised Hyperspectral Unmixing", IEEE Transactions on Signal Processing, vol. 60, No. 2, Feb. 2012, pp. 585-599 (15 pages total).

* cited by examiner

*Primary Examiner* — Khanh C Tran
(74) *Attorney, Agent, or Firm* — Rothwell, Figg, Ernst & Manbeck, P.C.

(57) ABSTRACT

Using information contained in clipped samples from analog-to-digital (ADC) conversion to improve receiver performance, by, for example, reducing the clipping distortion caused by ADCs due to its data resolution constraints. This provides an advantage over existing solutions, which perform suboptimally because the existing solution discard information in tire clipped samples.

15 Claims, 7 Drawing Sheets b = 4 bits b = 6 bits

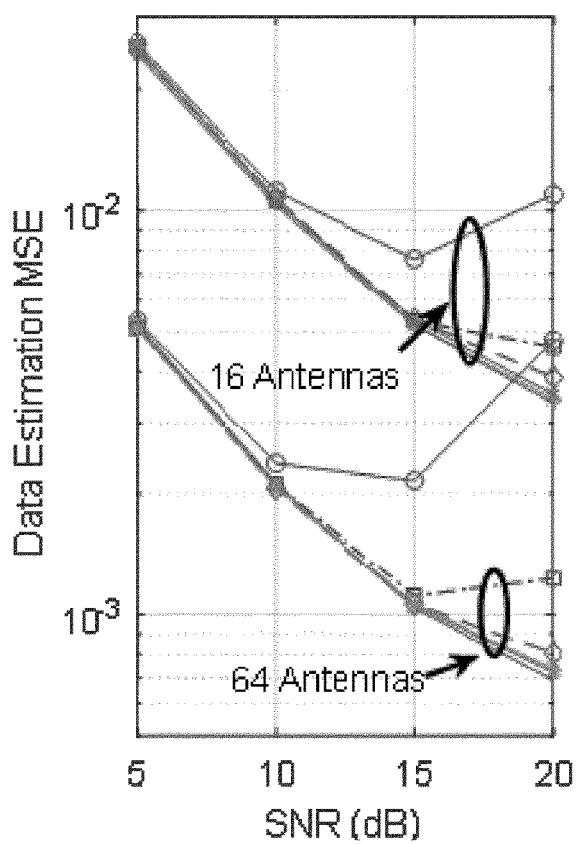
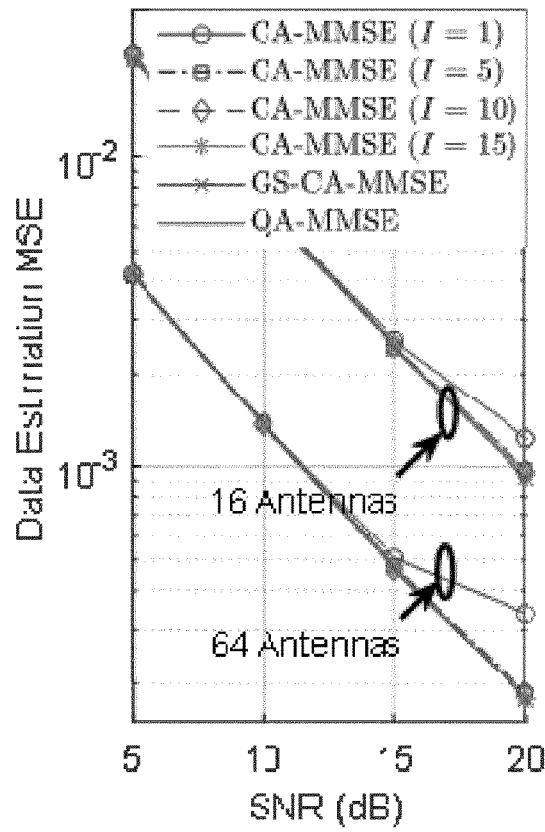
FIG. 3A
FIG. 3B

RECONSTRUCTION OF CLIPPED SIGNALS

CROSS REFERENCE TO RELATED APPLICATION(S)

This application is a 35 U.S.C. § 371 National Stage of International Patent Application No. PCT/EP2019/060364, filed Apr. 23, 2019.

TECHNICAL FIELD

Disclosed are embodiments related to the reconstruction of clipped signals, including the reconstruction of clipped signals in a massive multiple-input multiple-output (MIMO) system.

BACKGROUND

Clipping is a form of distortion that limits the values of a signal that lie above or below certain threshold. In practice, Clipping may be necessary due to system limitations (e.g., to avoid over modulating an audio transmitter). In discrete systems, it can be caused unintentionally due to data resolution constraints, such as when a sample exceeds the maximum value that can be represented, or intentionally as when simulating a process in which signal values are constrained.

Clipping is a nonlinear operation and introduces frequency components not present in the original signal. In the digital domain, when the frequencies of these new components exceed the Nyquist limit, the components are reflected into the baseband, causing aliasing.

Massive MIMO systems is now a well-established technology that forms the backbone of the fifth-generation (5G) 3GPP mobile network. With massive MIMO, the number of antennas at a base station (BS) is scaled up by several orders of magnitude compared to conventional multi-antenna systems with the goals of enabling significant gains, such as higher capacity and energy efficiency.

In a conventional multiple antenna BS, each radio-frequency (RF) port is connected to a pair of high-resolution analog-to-digital converters (ADCs) (typically, the inphase and quadrature signal components are quantized with resolutions exceeding 10 bits). Scaling such architectures to massive MIMO with hundreds or thousands active antenna elements would result in prohibitively high-power consumption and hardware costs. The hardware complexity and power consumption of ADCs scales roughly exponentially in the number of quantization bits. Thus, an effective solution to keep the power consumption and system costs within desirable limits is to reduce the precision of ADCs (e.g. up to 8 bits). An additional motivation for reducing the resolution of the employed ADCs is to limit the amount of data that must be transferred over the link that connects the RF components (a.k.a., Radio Unit (RU)) and the baseband-processing unit (BBU), which may be located remote from the RU.

An ADC can be modeled as two processes: sampling and quantization. Sampling converts a continuous time-varying voltage signal into a discrete-time signal—i.e., a sequence of real numbers. Quantization replaces each real number with an approximation from a finite set range of discrete values and performing clipping to limit the output to this range whenever the input exceeds the supported range. The error introduced by this clipping is referred to as overload distortion. Within the extreme limits of the supported range, the amount of spacing between the selectable output values of a quantizer is referred to as its granularity, and the error introduced by this spacing is referred to as granular distortion. It is common for the design of a quantizer to determine the proper balance between granular distortion and overload distortion. For a given supported number of possible output values, reducing the average granular distortion may involve increasing the average overload distortion, and vice versa.

SUMMARY

Certain challenges exist. For example, the overload distortion can severely affect the quality of a digital signal by corrupting the data it represents. Indeed, even a very low percentage of clipped samples result in a significant overload distortion. In multiuser MIMO (MU-MIMO) systems, overload distortion can cause inaccurate channel state information (CSI) and it deteriorates the data estimation at the BS and/or the user equipment (UEs) to which the BS provides network access.

This disclosure proposes to make use of information contained in the clipped samples from ADC conversion to improve the receiver performance, by, for example, reducing the clipping distortion caused by ADCs due to its data resolution constraints. This provides an advantage over existing solutions, which perform sub-optimally because the existing solution discard information in the clipped samples.

Accordingly, in one aspect there is provided a method for reconstructing the clipped samples and thus reducing the overload distortion by exploiting the correlation among the clipped and non-clipped samples. In one embodiment, the method includes receiving a signal y and sampling y, thereby producing a set of samples. The method further includes quantizing each sample in the set of samples to produce a quantized received signal r, wherein quantizing each sample in the set of samples comprises clipping at least M of the samples, wherein M>0, such that r comprises M clipped samples. The method also includes obtaining information denoting the clipped and non-clipped samples and using a probability density function of y and the information denoting the clipped and non-clipped samples to obtain a probability density function, $G(x)$, of the unknown samples in y that have been clipped conditional on the quantized received vector r. The method further includes modifying r by, for each clipped sample value in r, replacing the clipped sample value with an expected value that corresponds to the clipped sample value, wherein the expected value is based on $G(x)$, thereby producing a reconstructed received signal.

In another aspect there is provided a receiver apparatus being configured to: sample a received signal, y, thereby producing a set of samples; quantize each sample in the set of samples to produce a quantized received signal r, wherein quantizing each sample in the set of samples comprises clipping at least M of the samples, wherein M>0, such that r comprises M clipped samples; obtain information denoting the clipped and non-clipped samples; use a probability density function of y and the information denoting the clipped and non-clipped samples to obtain a probability density function, $G(x)$, of the unknown samples in y that have been clipped conditional on the quantized received vector r; and modify r by, for each clipped sample value in r, replacing the clipped sample value with an expected value that corresponds to the clipped sample value, wherein the expected value is based on $G(x)$, thereby producing a reconstructed received signal.

BRIEF DESCRIPTION OF THE DRAWINGS

The accompanying drawings, which are incorporated herein and form part of the specification, illustrate various embodiments.

FIG. 3A is a graphical plot illustrating an improvement provided by a CA-MMSE receiver according to an embodiment.

FIG. 3B is a graphical plot illustrating an improvement provided by a CA-MMSE receiver according to an embodiment.

DETAILED DESCRIPTION

Figure 1:
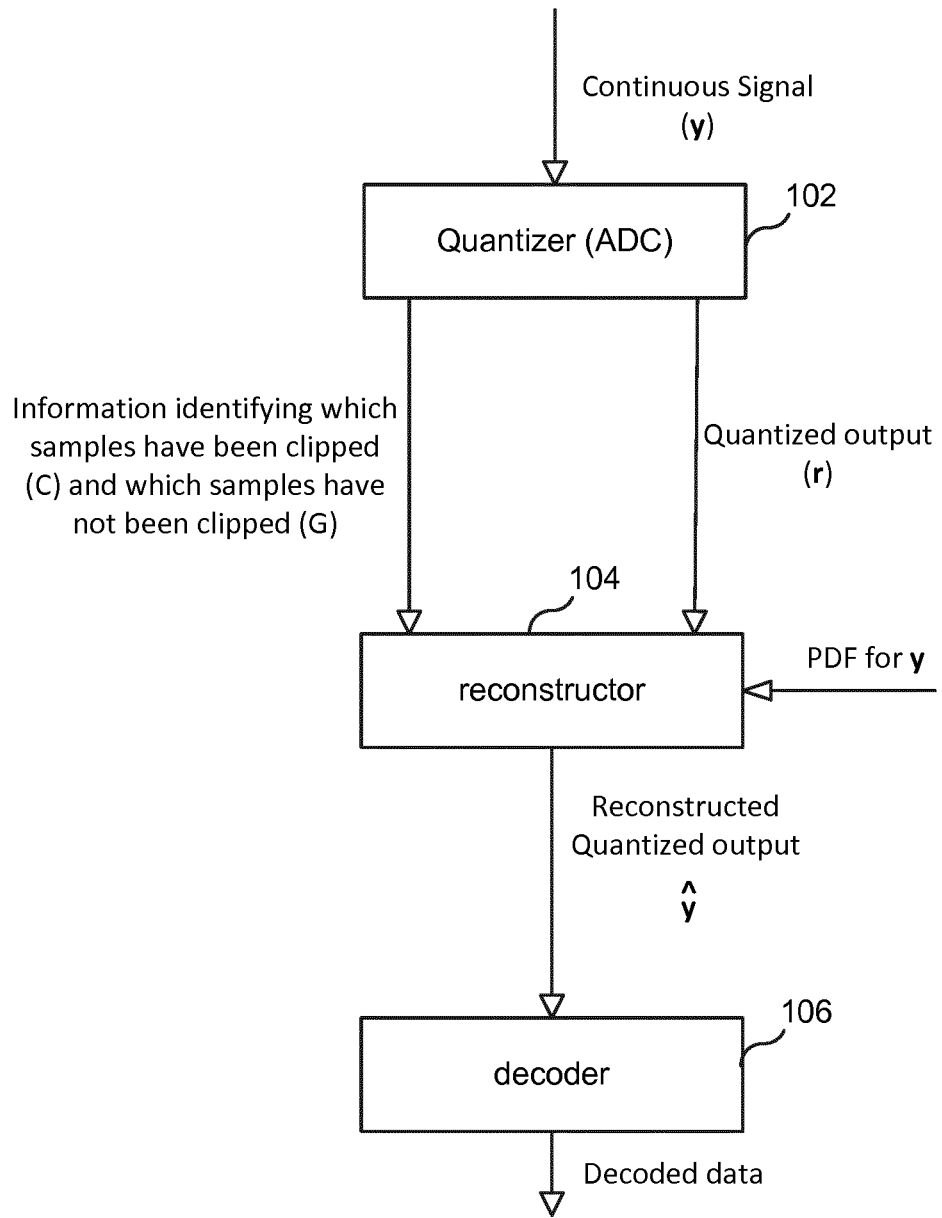
FIG. 1 illustrates a clipping-aware (CA) receiver according to an embodiment.

FIG. 1 illustrates components of a minimum mean-squared error (MMSE) based clipping aware receiver 100 (CA-MMSE receiver 100). CA-MMSE receiver 100 includes a quantizer 102 that receives an input signal y and produces a quantized output r. Quantizer 102 (e.g., ADC) also outputs information (C) indicating which samples of y have been clipped. For example, the set C denotes the indices of the clipped elements of the received vector r. The set G denotes the indices of the non-clipped elements of the received vector r.

CA-MMSE receiver 100 also includes a reconstructor 104 that reconstructs the clipped samples $y_\mathcal{C}$ conditional on the quantized received vector r. For example, reconstructor 104 reconstructs the clipped samples $r_\mathcal{C}$ ($r_\mathcal{C} = (r_i)_{i \in \mathcal{C}}$) by replacing each clipped sample value in r with its corresponding expected value of $y_\mathcal{C}$ $y_\mathcal{C} = (y_i)_{i \in \mathcal{C}}$, given the observed received vectors $r_\mathcal{C}$ and $r_\mathcal{G}$ $r_\mathcal{G} = (r_i)_{i \in \mathcal{G}}$) This approach is optimal, in the sense that it minimizes the mean-squared error between the unknown received signal $y_\mathcal{C}$ and its estimation $\hat{y}_\mathcal{C}$. Mathematically speaking:

$$\hat{y}_\mathcal{C} = \mathbb{E}\{y_\mathcal{C} \mid r_\mathcal{C}, r_\mathcal{G}\}$$

CA-MMSE receiver 100 further includes a decoder 106 that decodes the information output by reconstructor 104— i.e., $\hat{y}$, where $\hat{y} = [\hat{y}_\mathcal{C}\ r_\mathcal{G}]$.

1.1 System Model

Consider a single-cell MU-MIMO system, which includes a BS equipped with N antennas communicating with K single-antenna UEs, and assume that the BS and UEs are perfectly synchronized and operate a time division duplexing (TDD) protocol with universal frequency reuse. The N×1 received vector at the BS is:

$$y = \sqrt{\rho}Hx + n$$

where H is the N×N matrix of small-scale channel coefficients between the K UEs and BS. Moreover, x is the K×1 vector of independent, unit-power symbols transmitted simultaneously by the K UEs, with the average transmit power of each UE being ρ. Finally, n is the additive white Gaussian noise (AWGN)

1.2 Quantization of a Complex-Valued Vector

The in-phase and quadrature components of the received signal at each antenna are quantized separately by an ADC of b-bit resolution. More precisely, we model the ADCs as symmetric uniform quantizers with step size Δ and each ADC is characterized by a set of $L=2^b$ quantization levels $\mathcal{L}_b = \{l_1, \ldots l_{L-1}\}$ where $$l_i = \Delta\left(i - \frac{L-1}{2}\right), i = 0, \ldots L-1.$$

Moreover, we define a set of L+1 quantization thresholds $\mathcal{T} = \{\tau_1, \ldots, \tau_{L-1}\}$ such that $\infty = \tau_o < \tau_1 < \ldots < \tau_{L-1} < \tau_L = \infty$ and $$\tau_i = \Delta\left(i - \frac{L}{2}\right), i = 1, \ldots L-1$$

A practical technique for controlling the amplitude of the signal (or, equivalently, the quantization step size Δ) to achieve the appropriate balance between the granular and overload distortion is the use of automatic gain control (AGC). Next, we define the nonlinear quantizer-mapping function, which describes the joint operation of the 2N b-bit ADCs at the BS.

For convenience, we first define the Cartesian product $\mathcal{R}_b = \mathcal{L}_b \times \mathcal{L}_b$ and let $y_n$ and $r_n$ be the n-th element of the N×1 vectors y and r, respectively. Then, the quantizer-mapping function can be described by the function $Q_b(\cdot)$: $\mathcal{C}^N \to \mathcal{R}_b^N$ that maps the received continuous-valued signal y to the quantized output r in the following way: if $\mathcal{R}\{y_n\} \in (\tau_k, \tau_{k+1}]$ and $\mathcal{I}\{y_n\} \in (\tau_m, \tau_{m+1}]$, then $r_n = l_k + jl_m$. Thus, the quantized received signal r can be written as $$r = Q_b(Ay)$$
$$= Q_b(A\sqrt{\rho}Hx + An)$$

Where A is the N×N diagonal matrix of the automatic gain control (AGC) that scales the received signal y. Furthermore, $\mathcal{R}$ and $\mathcal{I}$ denote the real and imaginary part of the signal, respectively.

1.3 Augmented Real-valued Representation

Since ADCs quantize the real and imaginary parts (or the in-phase and quadrature components, respectively) of a signal separately, channel estimation and data detection should allow for processing the real and imaginary parts of received signals individually. Hence, it is convenient to transform the complex-valued problem (1) into an equivalent augmented real-valued representation using the following definitions:

$$x_R = \begin{pmatrix} \mathcal{R}\{x\} \\ \mathcal{I}\{x\} \end{pmatrix}$$

$$n_R = \begin{pmatrix} \mathcal{R}\{n\} \\ \mathcal{I}\{n\} \end{pmatrix}$$

$$H_R = \begin{pmatrix} \mathcal{R}\{H\} & -\mathcal{I}\{H\} \\ \mathcal{I}\{H\} & \mathcal{R}\{H\} \end{pmatrix}$$

Then the quantized signal can be written as $$y_R = \sqrt{\rho} H_R x_R + n_R \quad (1)$$

To facilitate notation, for the rest of the document, we have used y, r and x to denote $y_R$, $r_R$ and $x_R$, respectively.

We focus only on the reconstruction of the clipped samples of the quantized received signal r, while the samples that have not been clipped (i.e. within the granular region of the quantizer) are left unchanged after quantization. For notational convenience, we first define the following two sets of indices of the quantized received vector r, namely $\mathcal{C}$ and $\mathcal{G}$:

$$\mathcal{C} = \{i \in \{1, \ldots, 2N\} | r_i \in \{l_0, l_{L-1}\}\}$$

$$\mathcal{G} = \{i \in \{1, \ldots, 2N\} | r_i \in \{l_1, \ldots, l_{L-2}\}\}$$

That is, the set $\mathcal{C}$ denotes the indices of the clipped elements of the received vector r while the indices in the set $\mathcal{G}$ indicate the elements of r that belongs to the granular region of the quantizer. Then, we define the vectors $r_{\mathcal{C}} = (r_i)_{i \in \mathcal{C}}$, $r_{\mathcal{G}} = (r_i)_{i \in \mathcal{G}}$, $y_{\mathcal{C}} = (y_i)_{i \in \mathcal{C}}$ and $y_{\mathcal{G}} = (y_i)_{i \in \mathcal{G}}$. Notice that $r_{\mathcal{C}}$ and $r_{\mathcal{G}}$ represent the observed quantized received vectors of the clipped samples and the ones that lie within the granular region of the quantizer, respectively. On the other hand, the vectors $y_{\mathcal{C}}$ and $y_{\mathcal{G}}$ represent the unknown continuous signals which are quantized producing the vectors $r_{\mathcal{C}}$ and $r_{\mathcal{G}}$, respectively.

Next, we introduce the proposed clipping restoration receiver which reconstructs only the clipped samples $y_{\mathcal{C}}$ conditional on the quantized received vector r. The proposed receiver reconstructs the clipped samples $r_{\mathcal{C}}$ by replacing each clipped sample value in r with its corresponding expected value of $y_{\mathcal{C}}$, given the observed received vectors $r_{\mathcal{C}}$ and $r_{\mathcal{G}}$. This approach is optimal, in the sense that it minimizes the mean-squared error between the unknown received signal $y_{\mathcal{C}}$ and its estimation $\hat{y}_{\mathcal{C}}$. Mathematically speaking we have the following receiver:

$$\hat{y}_{\mathcal{C}} = \mathbb{E}\{y_{\mathcal{C}} | r_{\mathcal{C}}, r_{\mathcal{G}}\} \quad (2)$$

Thus, in determining the expectation in (2) we first require the posterior probability density function (p.d.f.) $p(y_{\mathcal{C}} r_{\mathcal{C}}, r_{\mathcal{G}})$ (in FIG. 5, it is also denoted G(x), where x refers to the unknown continuous samples $y_c$ conditional on r = $r_{\mathcal{C}} \cup r_{\mathcal{G}}$) which yields the probability of all feasible values $y_{\mathcal{C}}$ observing the quantized vector r. Next, we give a more detailed description of the proposed receiver given the fact the received continuous signal follows a Gaussian distribution.

Assume that the m-th (m∈$\mathcal{C}$) element of the vector r has been clipped. That is, it is $r_m = l_j$ where j∈{0, L-1}. Moreover, let $\hat{y}_m$ denotes estimated value (expectation) of the m-th unknown continuous sample $y_m$ of the vector $y_{\mathcal{C}}$. Thus, by the definition of the expectation in (2) we have:

$$\hat{y}_m = \int_{\alpha'}^{\beta'} y_m p(y_c | r_{\mathcal{G}}) dy_c. \quad (3)$$

where the posterior p.d.f. $p(y_{\mathcal{C}} | r_{\mathcal{G}})$ is one-sided truncated normal distribution within the interval [α', β']. Now, let $\alpha'_m$ and $\beta'_m$ be the m-th elements of the vectors α' and β', respectively. Notice that the interval [$\alpha'_m$, $\beta'_m$] denotes the feasible range of the unknown continuous value $y_m$ given its clipped observed sample and thus, its expected value is calculated within this interval. Conditional on the vector , each component of the unknown $y_c$ can be either (a) left truncated, i.e., $\alpha'_m = \tau_o = -\infty$ and $\beta'_m = \tau_1$ or (b) right truncated i.e., $\alpha'_m = \tau_{L-1}$ and $\beta'_m = \infty$.

It is worth mentioning that the elements of the received continuous vector are correlated and thus by observing $r_c$, $r_\mathcal{G}$ give us also information about the unknown clipped samples $y_{\mathcal{C}}$. This correlation is captured by the co-variance matrix of the posterior p.d.f. in (3).

The integral in expression (3) cannot be evaluated in closed form, thus we can resort to numerical integration to implement the estimator. However, for large number of clipped samples it becomes impractical. Thus, next we provide a low-complexity iterative algorithm for the approximation of the mean E{$y_c|r_C$, $r_G$} in (3). The algorithm relies on the expectation of M=|$\mathcal{C}$| closed-form one-dimensional conditionals of the one-sided truncated normal distribution, where M denotes the cardinality of the clipped samples.

Specifically, the j-th iteration, of this procedure returns the vector $\hat{y}_{\mathcal{C}}^{(j)} = [\hat{y}_1^{(j)}, \hat{y}_2^{(j)}, \ldots, \hat{y}_M^{(j)}]$ and it is described as follows:

$$\hat{y}_1^{(j)} = E\{y_1 | \hat{y}^{(j-1)}, \hat{y}_3^{(j)}, \ldots, \hat{y}_M^{(j)}, r\}$$

$$\hat{y}_2^{(j)} = E\{y_M | \hat{y}_2^{(j)}, \hat{y}_3^{(j)}, \ldots, \hat{y}_{M-1}^{(j)}, r\}$$

$$\hat{y}_2^{(j)} = E\{y_M | \hat{y}_2^{(j)}, \hat{y}_3^{(j)}, \ldots, \hat{y}_{M-1}^{(j)}, r\}$$

This procedure is repeated iteratively until the quantity $\|\hat{y}_{\mathcal{C}}^{(j)} - \hat{y}_{\mathcal{C}}^{(j-1)}\|_1$ is below a constant δ or the maximum number of iterations J has been exceeded. Next, we yield the closed-form expressions for the above expected values.

For notational convenience, we define the vector $\hat{y}_{-i} \equiv [\hat{y}_1, \ldots, \hat{y}_{i-1}, \hat{y}_{i+1}, \ldots, \hat{y}_M]$ where the i-th element of the vector $y_{\mathcal{C}}$ has been removed. Then, each expectation of the iterative algorithm is given by the following closed-form expression, which is the mean value for the univariate truncated normal distribution (see N.L. Johnson, S. Kotz, N. Balakrishnan, Continuous Univariate Distributions, $2^{nd}$ edition, Volume 1, 1994, Wiley):

$$\mathbb{E}\{y_i | \hat{y}_{-i}\} = \mu_i + \sigma_i \frac{\phi(\alpha) - \phi(\beta)}{\Phi(\beta) - \Phi(\alpha)} \quad (4)$$

where $\alpha = \frac{\tau_i - \tilde{\mu}_i}{\tilde{\sigma}_{ii}}$ and $\beta = \frac{\tau_{i+1} - \tilde{\mu}_i}{\tilde{\sigma}_{ii}}$.

Moreover, $$\phi(x) = \frac{1}{\sqrt{2\pi}} e^{-\frac{x^2}{2}}$$

is the probability density function of the standard normal distribution Φ(x)=½erfc(-x/√2) is its cumulative distribution function and erfc(·) is the complementary error function. The parameters $\mu_i$ and $\sigma_{ii}$ are given by the following formulas $$\mu_i = \mu_i + \sigma_{-i}^T \Sigma_{-i-i}^{-1}(w_{-i} - \mu_{-i}) \quad (5)$$

$$\sigma_{ii} = \sigma_{ii} - \sigma_i^T \Sigma_{-i-i}^{-1} \sigma_{-i} \quad (6)$$

where the (N−1)×(N−1) matrix $\Sigma_{-i-i}$ is formed by removing the i-th row and column from Σ, while the (N−1)×1 vector $\sigma_{-i}$ is the i-th column of $\Sigma$ after removing the i-th element. Furthermore the $(N-1) \times 1$ mean vector $\mu_{-i}$ results from $\mu$ after removing the i-th element. Furthermore, the variance $\sigma_{ii}$ corresponds to the i-th diagonal element of the co-variance matrix $\Sigma$. Finally, the parameters $\mu$ and $\Sigma$ are given by $$\mu = \Sigma_{12} \Sigma_{22}^{-1} r_G \tag{7}$$

$$\Sigma = \Sigma_{11} - \Sigma_{12} \Sigma_{22}^{-1} \Sigma_{12}^H \tag{8}$$

respectively, where $\Sigma_{11} = E\{y_C y_C^H\}$, $\Sigma_{12} = E\{y_C Y_{G\_hu}{}^H\}$ and $\Sigma_{22} = E\{y_G y_G^H\}$.

Concerning the computational complexity, the iterative algorithm requires the evaluation of simple closed form formulas. The main computational burden is due to the calculation of the M inverse matrices appearing in (5) and (6).

The proposed algorithm is a deterministic approximation of the Gibbs sampler, where the randomly generated samples of the Gibbs sampler are replaced by the means of the corresponding conditional distributions. It is worth mentioning that deterministic approximations of the Gibbs sampler have also been used in the context of the semi-supervised hyperspectral unmixing problems (see, e.g., K. E. Themelis and A. A. Rontogiannis and K. D. Koutroumbas, "A Novel Hierarchical Bayesian Approach for Sparse Semi-supervised Hyperspectral Unmixing", IEEE Trans. Signal Process., vol. 60, no. 2, pp. 585-599, February 2012).

The mapping in the expression (3) is a contraction in $\mathbb{R}$ with respect to the $\ell_1$ norm (and thus, it converges to a unique fixed solution) if the norm of the i-th diagonal element of the matrix $\Sigma^{-1}$ is greater than all entries of its corresponding row.

We now assess the mean-squared-error (MSE) with the proposed receiver on a massive MU-MIMO uplink system where each RF port at the BS is equipped with limited-resolution ADCs. The AGC is chosen to minimize the mean-squared error (MSE) between the non-quantized received vector y and the quantized vector r.

On this basis, by assuming 3-, 4- and 6-bit resolution ADC, then, on average 10%, 2% and 0.25% of samples in the received vector r are clipped, respectively.

Finally, we assume that the entries of the channel matrix H are independent and $y_G$ N(0,1)—distributed and define the average signal-to-noise ratio as $$SNR = \frac{\rho}{\sigma_n^2}.$$

Figure 2A:
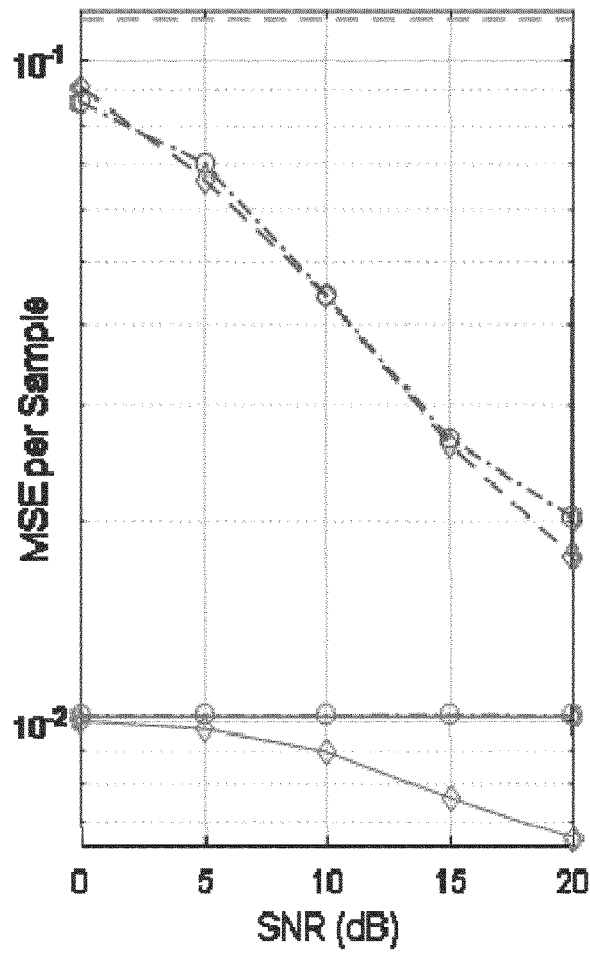
FIG. 2A is a graphical plot illustrating an improvement provided by a CA-MMSE receiver according to an embodiment.
Figure 2B:
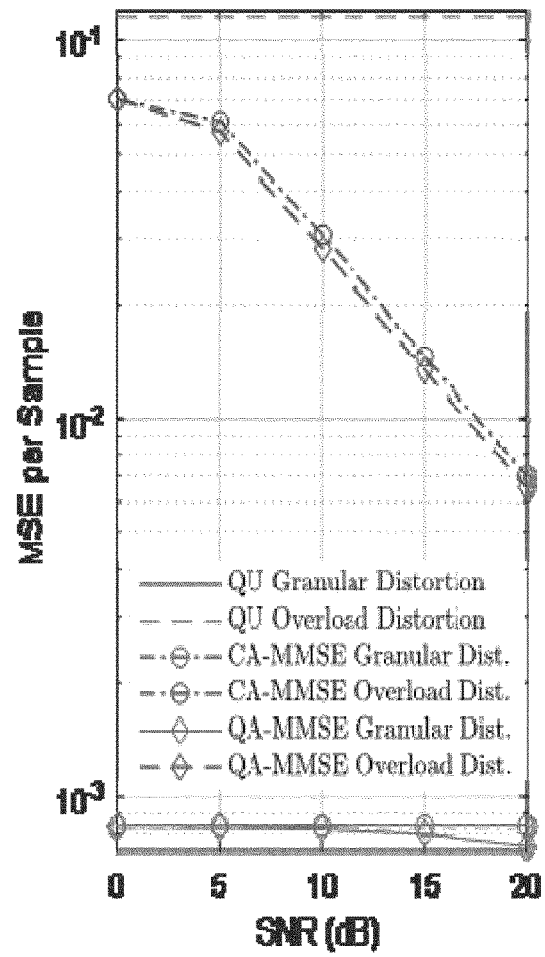
FIG. 2B is a graphical plot illustrating an improvement provided by a CA-MMSE receiver according to an embodiment.

First, in FIGS. 2A and 2B, we visualize the improvement of a clipping-aware MMSE (CA-MMSE) receivers on the average granular and overload distortion per sample. Recall that the CA-MMSE performs reconstruction only on the clipped samples while the granular samples are left unchanged, and thus, it does not give any improvement on the granular distortion. However, the CA-MMSE brings significant improvements on the overload distortion. For example, in the case of b=4 bits (FIG. 2A) and high signal-to-noise ratio (SNR) (i.e. 20 dB), it yields 83% less overload distortion compared to the quantization-unaware case (QU), where the quantized samples are not reconstructed. Indeed, when the resolution of the ADCs increases to b=6 bits (FIG. 2B), then the gain of the CA-MMSE on the overload distortion increases to 95%. The reason is that in an ADC with higher resolution, the granular distortion is lower and thus the CA-MMSE can reconstruct the clipped samples with higher precision. The latter result is of particular importance, since it implies that even a small percentage of clipped samples can result in significant overload distortion (Recall that when b=6 bits, the percentage of clipped samples is very low, i.e. 0.25%). Furthermore, notice that the overload distortion of the quantization-aware MMSE (QA-MMSE) (reconstructs both clipped samples and the ones that lie within the granular region) is similar to that of the CA-MMSE, which indicates the efficiency of the latter on the reconstruction of clipped samples.

Finally, notice that in the case of b=4 bits and high SNR, the QA-MMSE yields 37% lower granular distortion compared with the CA-MMSE, while when the resolution of ADCs increases to b=6 bits, as expected its granular gain is negligible. Even though, the QA-MMSE outperforms CA-MMSE on the granular distortion, it does not yield considerable improvements on the data estimation. The reason is that the overload distortion dominates the granular distortion per sample and thus it is more important to compensate for the overload distortion.

We now turn our attention to the convergence of iterative algorithm and confirm that it is sufficient to employ the CA-MMSE receiver 100 instead of the more computationally expensive QA-MMSE, i.e. $\hat{y} = [\mathbb{E}, \hat{y}_C] = \hat{y}_G \{y_C, y_G, r_C, r_G\}$. In FIGS. 3A and 3B, the MSE of the estimated symbol X are shown as a function of the average SNR for different number of BS antennas and ADC resolution. More precisely, we compare, the CA-MMSE implemented by the iterative algorithm with the clipping-aware receiver based on Gibbs sampling (GS-AC-MMSE) and the QA-MMSE. We note that if b=4 bits (FIG. 3A), then the CA-MMSE converges to the GS-AC-MMSE after only 15 iterations. However, notice that the CA-MMSE converges to the GS-CA-MMSE faster when the number of BS antennas is relatively small. The reason is that in the case of N=16 the clipped samples to be estimated are considerably less than in the case of N=64. Thus, the less the number of BS antennas, the faster the iterative CA-MMSE receiver. Likewise, the convergence is faster when the number of bits in the ADC is higher. Thus, in the case of b=6 bits (FIG. 3B), the convergence happens already at 5 iterations.

Moreover, it is worth mentioning that after 15 iterations the CA-MMSE is almost identical to the optimal QA-MMSE receiver confirming that it is sufficient to employ the CA-MMSE and reconstruct only the clipped samples, while the ones that have not been clipped within the granular region of the quantizer can be left intact. This result is of particular importance, since it implies that we can achieve almost optimal performance by employing lower complexity receivers.

Figure 4:
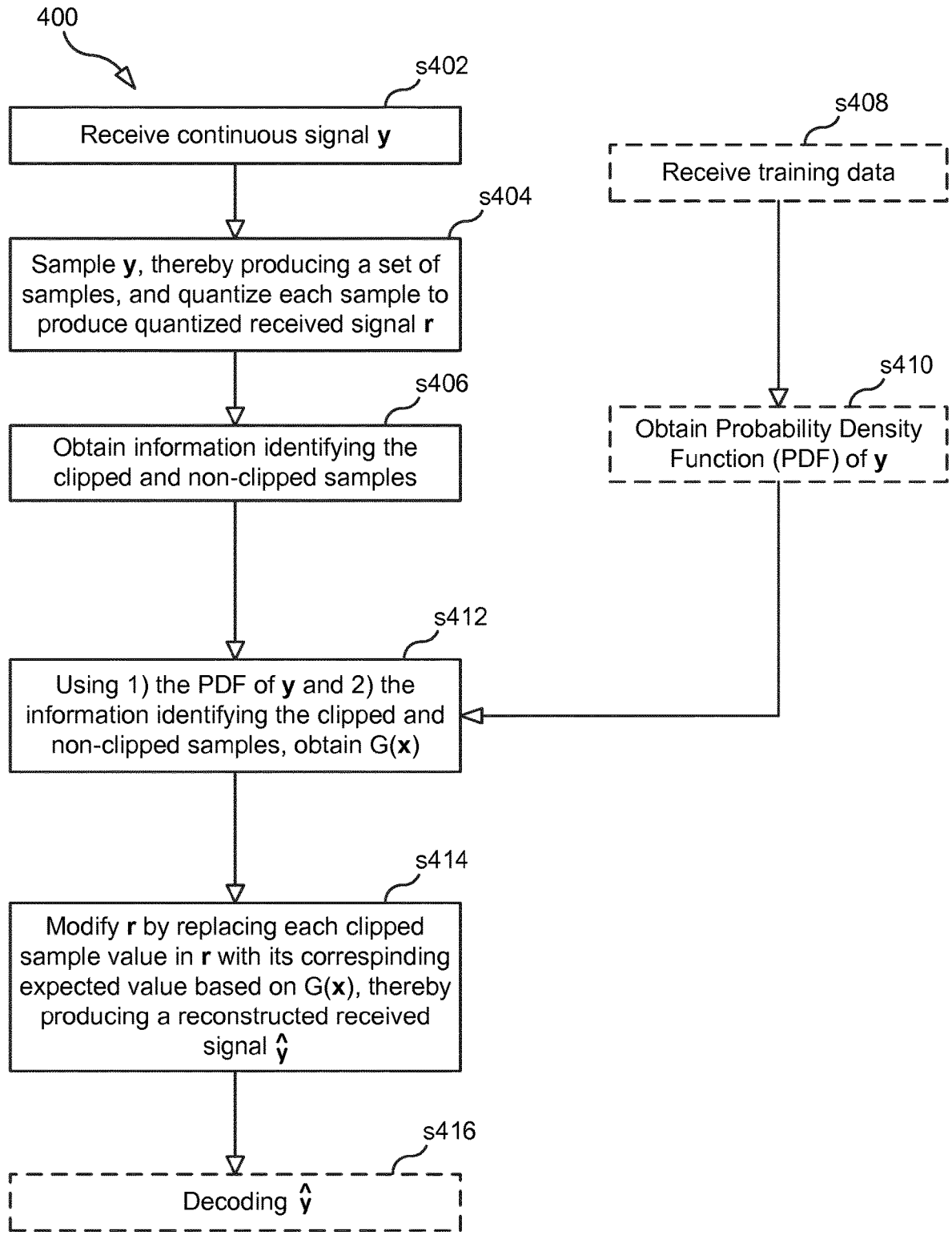
FIG. 4 is a flowchart illustrating a process according to an embodiment.

FIG. 4 is a flowchart illustrating a process 400 according to an embodiment. Process 400 may begin with step s402.

Step s402 comprises receiver 100 receiving a signal y.

Step s404 comprises receiver 100 sampling y, thereby producing a set of samples, and then quantizing each sample in the set of samples to produce a quantized received signal r, wherein quantizing each sample in the set of samples comprises clipping at least M of the samples, wherein M>0, such that r comprises M clipped samples.

Step s406 comprises receiver 100 obtaining information denoting the clipped and non-clipped samples. For example, obtaining a list of the clipped samples and/or the non-clipped samples.

Step s412 comprises receiver 100 using a probability density function of y and the information denoting the clipped and non-clipped samples to obtain the probability density function G(x) of the unknown samples in y that have been clipped given the received quantized vector r, where $x=(x_1, \ldots, x_M)$, represents the unknown values before being clipped to the vector $r_c$.

Step s414 comprises receiver 100 modifying r by, for each clipped sample value in r, replacing the clipped sample value with an expected value that corresponds to the clipped sample value, wherein the expected value is based on G(x), thereby producing a reconstructed received signal.

Process 400 may also include steps s408, s410, and s416. Step s408 and s410 comprise receiving training data and using the received training data to obtain the probability density function of y, respectively. Step s416 comprises decoding ŷ.

Figure 5:
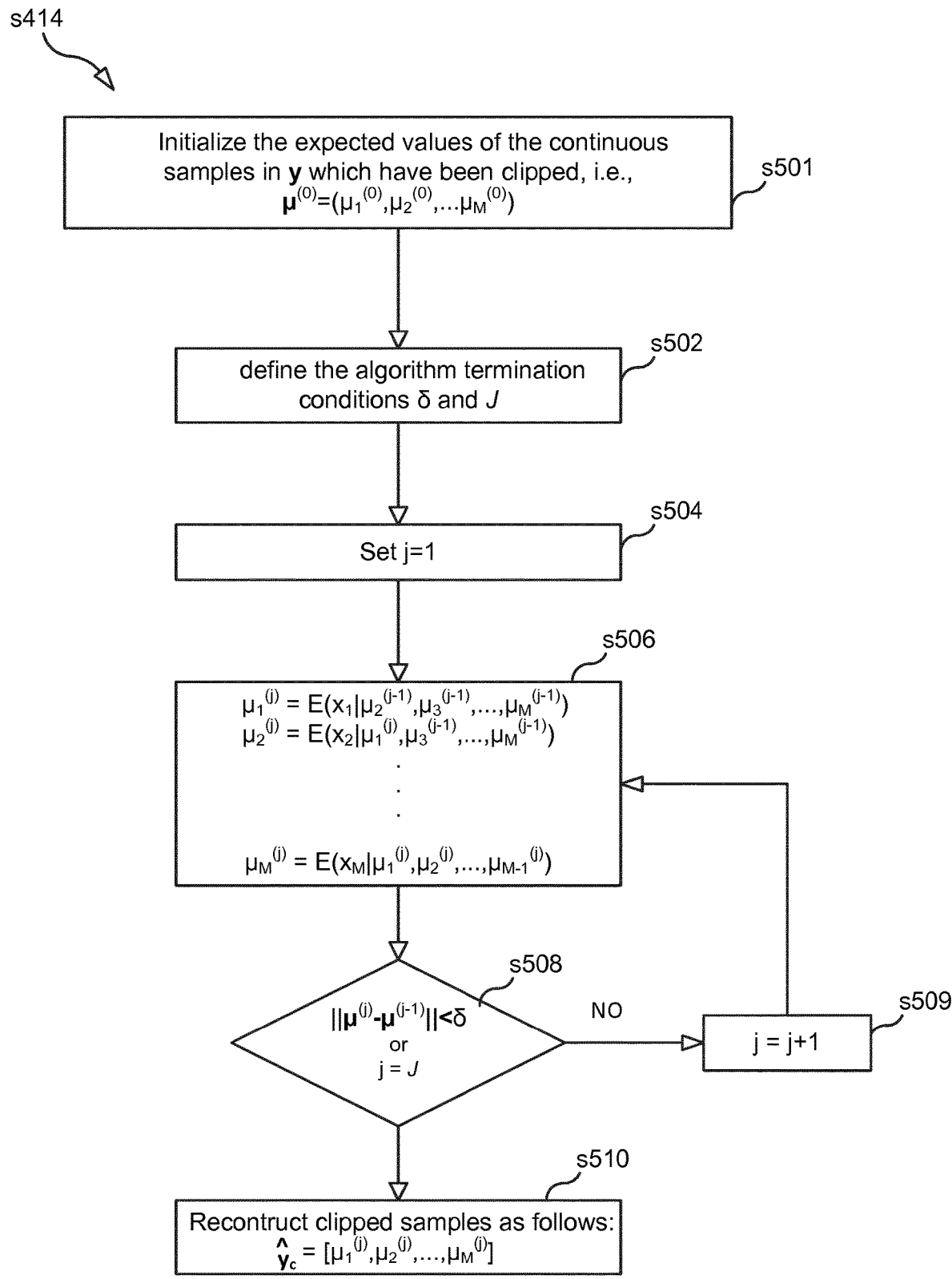
FIG. 5 is a flowchart illustrating a process according to an embodiment.

FIG. 5 is a flowchart illustrating a process 500 according to an embodiment for implementing step s414. Process 500 may begin with step s501.

Step s501 comprises initializing the expected values of the samples in y which have been clipped, i.e., $\mu^{(0)}=(\mu_1^{(0)}, \mu_2^{(0)}, \ldots \mu_M^{(0)})$. The initial values here equal their corresponding clipped values.

That is, in step s501 a first vector $\mu^{(0)}$ is initialized, wherein the first vector consists of the values $\mu_1^{(0)}, \mu_2^{(0)}, \mu_3^{(0)}, \ldots, \mu_M^{(0)}$.

Step s502 comprises defining the termination conditions δ and J.

Step s504 comprises setting j=1.

Step s506 comprises determining $\mu^{(j)}$, which is a vector of expected values. determining $\mu^{(j)}$ comprises calculating each element $\mu_i^{(j)}$ of the vector, for i=1 to M, wherein M is equal to the total number of clipped samples. That is determining $\mu^{(j)}$ comprises calculating:

$$\mu_1^{(j)} = E(x_1 \mid \mu_2^{(j-1)}, \mu_3^{(j-1)}, \ldots, \mu_M^{(j-1)})$$
$$\mu_2^{(j)} = E(x_2 \mid \mu_1^{(j)}, \mu_3^{(j-1)}, \ldots, \mu_M^{(j-1)})$$
$$\vdots$$
$$\mu_M^{(j)} = E(x_M \mid \mu_1^{(j)}, \mu_2^{(j)}, \ldots, \mu_{M-1}^{(j)}).$$

$E(x_1|\mu_2^{(j-1)}, \mu_3^{(j-1)}, \ldots, \mu_M^{(j-1)})$ is the expected value of the first clipped sample based on the p.d.f. $G(x_1|x_2=\mu_2^{(j-1)}, x_3=\mu_3^{(j-1)})$; $E(x_2|\mu_1^{(j)}, \mu_3^{(j-1)}, \ldots, \mu_M^{(j-1)})$ is the expected value of the second clipped sample based on $G(x_2|x_1=\mu_1^{(j)}, x_3=\mu_3^{(j-1)}, \ldots x_M=\mu_M^{(j-1)})$; . . . ; and $E(x_M|\mu_1^{(j)}, \mu_3^{(j)}, \ldots, \mu_M^{(j)})$ is the expected value of the M-th clipped sample based on $G(x_M|x_1=\mu_1^{(j)}, x_2=\mu_2^{(j)}, \ldots x_{M-1}=\mu_{M-1}^{(j)})$.

After $\mu^{(j)}$ is determined, it is then determined in step s508 whether:

$$\|\mu^{(j)}-\mu^{(j-1)}\|<\delta \text{ or } j=J.$$

If $\|\mu^{(j)}-\mu^{(j-1)}\|<\delta$ or j=j is true, then the process proceeds to step s510, otherwise the process proceeds to step s509, where j is incremented by one. After step s509, the process goes back to step s506.

Step s510 comprises setting $\hat{y}_c=[\mu_1^{(j)}, \mu_2^{(j)}, \ldots, \mu_M^{(j)}]$. For example, as a result of determining that $\|\mu^{(1)}-\mu^{(0)}\|$ is less than δ the first clipped sample value in r is replaced with $\mu_1^{(1)}$, the second clipped sample value in r is replaced with $\mu_2^{(1)}$ . . . , and the M-th clipped sample value in r is replaced with $\mu_M^{(1)}$.

Figure 6:
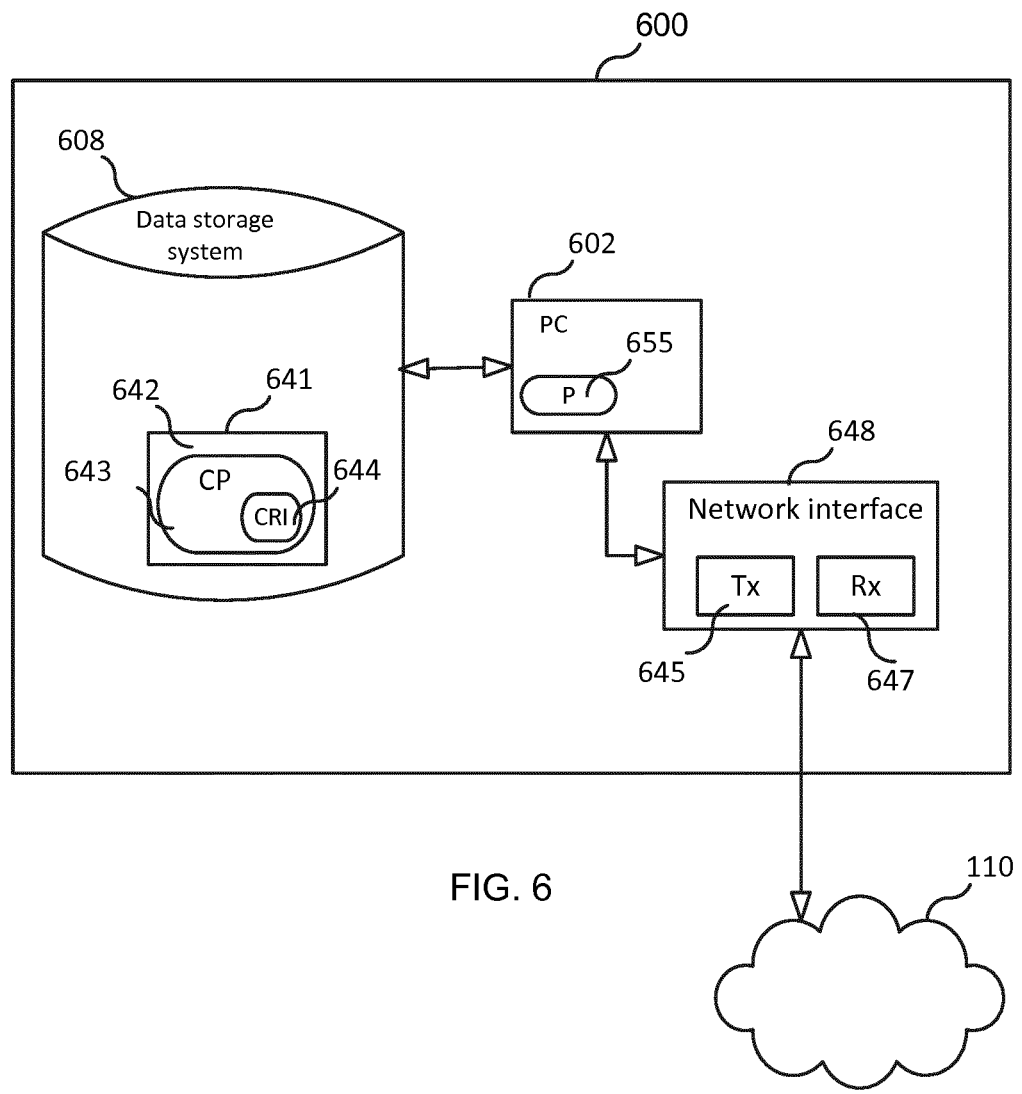
FIG. 6 is a block diagram of an apparatus according to an embodiment.

FIG. 6 is a block diagram of a receiver apparatus 600, according to some embodiments. Receiver apparatus 600 can be used to implement receiver 100. As shown in FIG. 6, receiver apparatus 600 may comprise: processing circuitry (PC) 602, which may include one or more processors (P) 655 (e.g., a general purpose microprocessor and/or one or more other processors, such as an application specific integrated circuit (ASIC), field-programmable gate arrays (FPGAs), and the like), which processors may be co-located in a single housing or in a single data center or may be geographically distributed (i.e., receiver apparatus 600 may be a distributed computing apparatus); a network interface 648 comprising a transmitter (Tx) 645 and a receiver (Rx) 647 for enabling apparatus 600 to transmit data to and receive data from other nodes connected to network 110 (e.g., an Internet Protocol (IP) network) to which network interface 648 is connected; and a local storage unit (a.k.a., "data storage system") 608, which may include one or more non-volatile storage devices and/or one or more volatile storage devices. In embodiments where PC 602 includes a programmable processor, a computer program product (CPP) 641 may be provided. CPP 641 includes a computer readable medium (CRM) 642 storing a computer program (CP) 643 comprising computer readable instructions (CRI) 644. CRM 642 may be a non-transitory computer readable medium, such as, magnetic media (e.g., a hard disk), optical media, memory devices (e.g., random access memory, flash memory), and the like. In some embodiments, the CRI 644 of computer program 643 is configured such that when executed by PC 602, the CRI causes apparatus 600 to perform steps described herein (e.g., steps described herein with reference to the flow charts). In other embodiments, apparatus 600 may be configured to perform steps described herein without the need for code. That is, for example, PC 602 may consist merely of one or more ASICs. Hence, the features of the embodiments described herein may be implemented in hardware and/or software.

Figure 7:
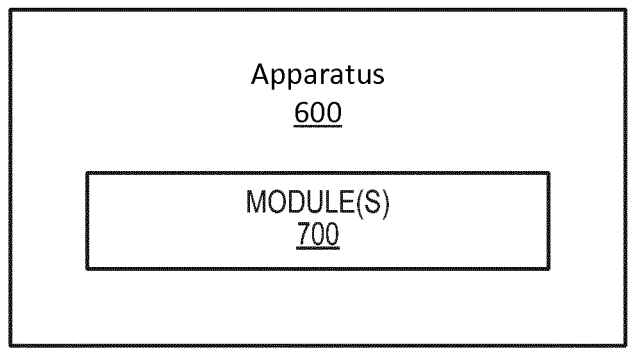
FIG. 7 is a schematic block diagram of an apparatus according to an embodiment.

FIG. 7 is a schematic block diagram of the receiver apparatus 600 according to some other embodiments. The receiver apparatus 600 includes one or more modules 700, each of which is implemented in software. The module(s) 700 provide the functionality of apparatus 600 described herein (e.g., the steps described above, e.g., with respect to FIG. 4 and/or FIG. 5).

While various embodiments of the present disclosure are described herein, it should be understood that they have been presented by way of example only, and not limitation. Thus, the breadth and scope of the present disclosure should not be limited by any of the above-described exemplary embodiments. Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. Any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel. That is, the steps of any methods disclosed herein do not have to be performed in the exact order disclosed, unless a step is explicitly described as following or preceding another step and/or where it is implicit that a step must follow or precede another step.

The invention claimed is:

1. A method implemented by a receiver, the method comprising:
receiving a signal y;
sampling y, thereby producing a set of samples;
quantizing each sample in the set of samples to produce a quantized received signal r, wherein quantizing each sample in the set of samples comprises clipping at least M of the samples, wherein M>0, such that r comprises M clipped samples;
obtaining information denoting the clipped and non-clipped samples;
using a probability density function of y and the information denoting the clipped and non-clipped samples to obtain a probability density function, G(x), of the unknown samples in y that have been clipped conditional on the quantized received vector r; and
modifying r by, for each clipped sample value in r, replacing the clipped sample value with an expected value that corresponds to the clipped sample value, wherein the expected value is based on G(x), thereby producing a reconstructed received signal.

2. The method of claim 1, further comprising decoding the reconstructed received signal.

3. The method of claim 1, further comprising receiving training data and using the received training data to obtain the probability density function of y.

4. The method of claim 1, further comprising determining the corresponding expected values.

5. The method of claim 4, wherein determining the corresponding expected values comprises:
initializing a first vector $\mu^{(0)}$, wherein $\mu^{(0)}$ is a vector consisting of the values $\mu_1^{(0)}, \mu_2^{(0)}, \ldots \mu_M^{(0)}$);
defining a first termination condition, $\delta$, and a second termination condition, J;
calculating a second vector $\mu^{(1)}$ based on $\mu^{(0)}$ and G(x); and
determining whether $\|\mu^{(1)} - \mu^{(0)}\|$ is less than $\delta$ or an index value, j, equals J.

6. The method of claim 5, wherein calculating $\mu^{(1)}$ based on $\mu^{(0)}$ and G(x) comprises:
calculating $\mu_1^{(1)} = E(x_1|\mu_2^{(0)}, \mu_3^{(0)}, \ldots, \mu_M^{(0)})$, wherein $E(x_1|\mu_2^{(0)}, \mu_3^{(0)}, \ldots, \mu_M^{(0)})$ is an expected value of the first clipped sample given $\mu_2^{(0)}, \mu_3^{(0)}, \ldots \mu_M^{(0)}$ and $G(x_1|x_2=\mu_2^{(0)}, x_3=\mu_3^{(0)}, \ldots x_M=\mu_M^{(0)})$; and calculating $\mu_2^{(1)} = E(x_2|\mu_1^{(1)}, \mu_3^{(0)}, \ldots, \mu_M^{(0)})$, wherein $E(x_2|\mu_1^{(1)}, \mu_3^{(0)}, \ldots, \mu_M^{(0)})$ is an expected value of the second clipped sample given $\mu_1^{(0)}, \mu_3^{(0)}, \ldots \mu_M^{(0)}$ and $G(x_2|x_1=\mu_1^{(1)}, x_3=\mu_3^{(0)}, \ldots x_M=\mu_M^{(0)})$.

7. The method of claim 6, wherein modifying r by replacing each clipped sample in r with its corresponding expected value comprises:
as a result of determining that $\|\mu^{(1)} - \mu^{(0)}\|$ is less than $\delta$ or j=J, replacing the first clipped sample value in r with $\mu_1^{(1)}$ and replacing the second clipped sample value in r with $\mu_2^{(1)}$.

8. A receiver apparatus, the receiver apparatus being configured to:
sample a received signal, y, thereby producing a set of samples;
quantize each sample in the set of samples to produce a quantized received signal r, wherein quantizing each sample in the set of samples comprises clipping at least M of the samples, wherein M>0, such that r comprises M clipped samples;
obtain information denoting the clipped and non-clipped samples;
use a probability density function of y and the information denoting the clipped and non-clipped samples to obtain a probability density function, G(x), of the unknown samples in y that have been clipped conditional on the quantized received vector r; and
modify r by, for each clipped sample value in r, replacing the clipped sample value with an expected value that corresponds to the clipped sample value, wherein the expected value is based on G(x), thereby producing a reconstructed received signal.

9. The receiver apparatus of claim 8, further comprising decoding the reconstructed received signal.

10. The receiver apparatus of claim 8, further comprising receiving training data and using the received training data to obtain the probability density function of y.

11. The receiver apparatus of claim 8, further comprising determining the corresponding expected values.

12. The receiver apparatus of claim 11, wherein determining the corresponding expected values comprises:
initializing a first vector $\mu^{(0)}$, wherein $\mu^{(0)}$ is a vector consisting of the values $\mu_1^{(0)}, \mu_2^{(0)}, \mu_3^{(0)}, \ldots \mu_M^{(0)}$);
defining a first termination condition, $\delta$, and a second termination condition, J;
calculating a second vector $\mu^{(1)}$ based on $\mu^{(0)}$ and G(x); and
determining whether $\|\mu^{(1)} - \mu^{(0)}\|$ is less than $\delta$ or an index value, j, equals J.

13. The receiver apparatus of claim 12, wherein calculating $\mu^{(1)}$ based on $\mu^{(0)}$ and G(x) comprises:
calculating $\mu_1^{(1)} = E(x_1|\mu_2^{(0)}, \mu_3^{(0)}, \ldots, \mu_M^{(0)})$, wherein $E(x_1|\mu_2^{(0)}, \mu_3^{(0)}, \ldots, \mu_M^{(0)})$ is an expected value of the first clipped sample given $\mu_2^{(0)}, \mu_3^{(0)}, \ldots \mu_M^{(0)}$ and $G(x_1|x_2=\mu_2^{(0)}, x_3=\mu_3^{(0)}, \ldots x_M=\mu_M^{(0)})$; and calculating $\mu_2^{(1)} E(x_2|\mu_1^{(1)}, \mu_3^{(0)}, \ldots, \mu_M^{(0)})$, wherein $E(x_2|\mu_1^{(1)}, \mu_3^{(0)}, \ldots, \mu_M^{(0)})$ is an expected value of the second clipped sample given $\mu_1^{(0)}, \mu_3^{(0)}, \ldots \mu_M^{(0)}$ and $G(x_2|x_1=\mu_1^{(1)}, x_3=\mu_3^{(0)}, \ldots x_M=\mu_M^{(0)})$.

14. The receiver apparatus of claim 13, wherein modifying r by replacing each clipped sample in r with its corresponding expected value comprises:
as a result of determining that $\|\mu^{(1)} - \mu^{(0)}\|$ is less than $\delta$ or j=J, replacing the first clipped sample value in r with $\mu_1^{(1)}$ and replacing the second clipped sample value in r with $\mu_2^{(1)}$.

15. A non-transitory computer readable medium storing a computer program comprising instructions which when executed by processing circuitry of a receiver apparatus causes the receiver apparatus to:
sample a received signal, y, thereby producing a set of samples;
quantize each sample in the set of samples to produce a quantized received signal r, wherein quantizing each sample in the set of samples comprises clipping at least M of the samples, wherein M>0, such that r comprises M clipped samples;
obtain information denoting the clipped and non-clipped samples;
use a probability density function of y and the information denoting the clipped and non-clipped samples to obtain a probability density function, G(x), of the unknown samples in y that have been clipped conditional on the quantized received vector r; and modify r by, for each clipped sample value in r, replacing the clipped sample value with an expected value that corresponds to the clipped sample value, wherein the expected value is based on G(x), thereby producing a reconstructed received signal.

\* \* \* \* \*